United States Patent
Jung et al.

(10) Patent No.: US 9,899,209 B2
(45) Date of Patent: Feb. 20, 2018

(54) ELECTRICALLY CONDUCTIVE THIN FILMS

(71) Applicant: SAMSUNG ELECTRONICS CO., LTD., Suwon-si, Gyeonggi-do (KR)

(72) Inventors: Doh Won Jung, Seoul (KR); Hee Jung Park, Daejeon (KR); Yoon Chul Son, Hwaseong-si (KR); Yun Sung Woo, Yongin-si (KR); Jongmin Lee, Hwaseong-si (KR); Yong Hee Cho, Seoul (KR); Kyoung-Seok Moon, Hwaseong-si (KR); Jae-Young Choi, Suwon-si (KR); Kimoon Lee, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 17 days.

(21) Appl. No.: 14/870,265

(22) Filed: Sep. 30, 2015

(65) Prior Publication Data

US 2016/0163410 A1    Jun. 9, 2016

(30) Foreign Application Priority Data

Dec. 8, 2014 (KR) .................. 10-2014-0175234

(51) Int. Cl.
*H01B 1/02* (2006.01)
*B32B 15/04* (2006.01)
(Continued)

(52) U.S. Cl.
CPC ........ *H01L 21/02186* (2013.01); *B32B 15/04* (2013.01); *H01B 1/02* (2013.01);
(Continued)

(58) Field of Classification Search
None
See application file for complete search history.

(56) References Cited

U.S. PATENT DOCUMENTS 7,858,206 B2   12/2010   Furubayashi et al.
8,551,609 B2   10/2013   Lu et al.
(Continued)

FOREIGN PATENT DOCUMENTS

KR   1020070048780 A   5/2007
KR   1020090120459 A   11/2009
(Continued)

OTHER PUBLICATIONS

Chen et al., "Synthesis of {010}-faceted anatase TiO2 nanoparticles from layered titanate for dye-sensitized solar cells", Cryst. Eng. Comm., vol. 16, 2014, pp. 8885-8895.
(Continued)

*Primary Examiner* — Katie L Hammer
(74) *Attorney, Agent, or Firm* — Cantor Colburn LLP

(57) ABSTRACT

An electrically conductive thin film including a plurality of nanosheets including a doped titanium oxide represented by Chemical Formula 1 and having a layered crystal structure:

$(A_\alpha Ti_{1-\alpha})O_{2+\delta}$     Chemical Formula 1 wherein, in Chemical Formula 1, δ is greater than 0, A is at least one dopant metal selected from Nb, Ta, V, W, Cr, and Mo, and α is greater than 0 and less than 1. Also, an electronic device including the electrically conductive thin film.

14 Claims, 18 Drawing Sheets

(51) Int. Cl.
    *H01L 21/02* (2006.01)
    *H01L 27/01* (2006.01)
    *B32B 5/16* (2006.01)

(52) U.S. Cl.
    CPC .. *H01L 21/02172* (2013.01); *H01L 21/02197* (2013.01); *H01L 27/016* (2013.01); *B32B 5/16* (2013.01); *B32B 2307/202* (2013.01); *B32B 2307/704* (2013.01)

(56) References Cited

U.S. PATENT DOCUMENTS

| | | | |
|---|---|---|---|
| 2002/0155660 A1* | 10/2002 | Beitel | H01L 28/60 438/240 |
| 2006/0078726 A1* | 4/2006 | Antonio | C01G 23/04 428/328 |
| 2007/0287025 A1* | 12/2007 | Furubayashi | C03C 17/2456 428/640 |
| 2010/0075176 A1 | 3/2010 | Yamada et al. | |
| 2013/0101829 A1* | 4/2013 | Sasaki | B05D 3/06 428/323 |
| 2013/0104971 A1 | 5/2013 | Wang et al. | |
| 2014/0037988 A1 | 2/2014 | Ganjoo et al. | |

FOREIGN PATENT DOCUMENTS

| | | |
|---|---|---|
| KR | 1020130024919 A | 3/2013 |
| WO | 2008/044474 A1 | 4/2008 |

OTHER PUBLICATIONS

Harada et al., "Preparation and characterizations of Fe- or Ni-substituted titania nanosheets as photocatalysts", Journal of Photochemistry and Photobiology A: Chemistry, vol. 148, 2002, pp. 273-276.

Hitosugi et al., "Properties of TiO2-based transparent conducting oxides", Phys. Status Solidi., A207, No. 7, 2010, pp. 1529-1537.

Ida et al., "Photoluminescence of Perovskite Nanosheets Prepared by Exfoliation of Layered Oxides, K2Ln2TI3O10, KLnNb2O7, and RbLnTa2O7 (Ln: Lanthanide Ion)", J. Am. chem. Soc.,vol. 130, 2008, pp. 7052-7059.

Manga et al., "Multilayer Hybrid Films Consisting of Alternating Graphene and Titania Nanosheets with Ultrafast Electron Transfer and Photoconversion Properties", Adv. Funct. Mater., vol. 19, 2009, pp. 3638-3643.

Novoselov et al., "Electric Field Effect in Atomically Thin Carbon Films", Science, vol. 306, 2004, pp. 666-669.

Sasaki et al., "A Mixed Alkali Metal Titanate with the Lepidocrocite-like Layered Structure. Preparation, Crystal Structure, Protonic Form, and Acid-Base Intercalation Properties", Chem., Mater., vol. 10, 1998, pp. 4123-4128.

Tanaka et al., "Oversized Titania Nanosheet Crystallites Derived from Flux-Grown Layered Titanate Single Crystals", Chem. Mater., vol. 15, 2003, pp. 3564-3568.

Wang et al., "Electronics and optoelectronics of two-dimensional transition metal dichalcogenides", Nature Nanotechnology, vol. 7, Nov. 2012, pp. 699-712.

\* cited by examiner

ELECTRICALLY CONDUCTIVE THIN FILMS

CROSS-REFERENCE TO RELATED APPLICATION

This application claims priority to and the benefit of Korean Patent Application No. 10-2014-0175234, filed in the Korean Intellectual Property Office on Dec. 8, 2014, and all the benefits accruing therefrom under 35 U.S.C. § 119, the entire content of which is incorporated herein by reference.

BACKGROUND

1. Field

The present disclosure relates to an electrically conductive thin film and an electronic device including the same.

2. Description of the Related Art

An electronic device, such as a flat panel display, for example an LCD or LED, a touch screen panel, a solar cell, a transparent transistor, and the like may include an electrically conductive film or transparent electrically conductive film. It is desirable for a material of an electrically conductive film to have high light transmittance (e.g., greater than or equal to about 80% in a visible light region) and low specific resistance (e.g., less than or equal to about $1\times10^{-4}$ $\Omega^*$cm). Currently available oxide materials for electrically conductive films include indium tin oxide (ITO), tin oxide ($SnO_2$), zinc oxide (ZnO), and the like. ITO is a transparent electrode material and is a degenerate semiconductor having a bandgap of 3.75 eV, and may be manufactured in a large area using a sputtering process. However, in terms of application to a flexible touch panel, or a UD-grade high resolution display, ITO has poor flexibility and inevitably will cost more due to limited reserves of indium. Therefore, development of an alternative material is desired.

Recently, a flexible electronic device, e.g., a bendable or foldable electronic device, has been drawing attention as a next generation electronic device. Therefore, there is a need for development of a material having transparency, relatively high electrical conductivity, and flexibility, as well as a transparent and flexible electrode material.

SUMMARY

An embodiment provides a flexible electrically conductive thin film with improved electrical conductivity and excellent light transmittance.

Another embodiment provides an electronic device including the electrically conductive thin film.

In an embodiment, an electrically conductive thin film includes: a plurality of nanosheets including a doped titanium oxide represented by Chemical Formula 1 and having a layered crystal structure:

$$(A_\alpha Ti_{1-\alpha})O_{2+\delta} \qquad \text{Chemical Formula 1}$$

wherein, in Chemical Formula 1, δ is greater than 0, A is at least one dopant metal selected from Nb, Ta, V, W, Cr, and Mo, and α is greater than 0 and less than 1.

The conductive thin film may have light transmittance for light having a wavelength of 550 nanometers of greater than or equal to about 80 percent at a thickness of less than or equal to 10 nanometers.

The titanium oxide may be represented by the formula $(A_\alpha Ti_{1-\alpha})_{1.73}O_4$, wherein A is at least one dopant metal selected from Nb, Ta, V, W, Cr, and Mo, and α is greater than 0 and less than 1.

The content of the dopant may be less than about 13 atomic percent, based on a total content of titanium.

The nanosheets may have a longest average length of greater than or equal to 0.2 micrometers.

The conductive thin film may include the plurality of nanosheets that contact each other to provide an electrical connection.

Another embodiment provides an electronic device including the electrically conductive thin film.

The electronic device may be a flat panel display, a touch screen panel, a solar cell, an e-window, an electrochromic mirror, a heat mirror, a transparent transistor, or a flexible display.

Yet another embodiment provides a method of manufacturing an electrically conductive thin film, the method including: providing a doped titanium dioxide including at least one dopant selected from Nb, Ta, V, W, Cr, and Mo; mixing the doped titanium dioxide, potassium carbonate, lithium carbonate, and molybdenum oxide in a selected ratio to obtain a lithium potassium titanate represented by Chemical Formula 2 and having a layered crystal structure:

$$K_x(A_\alpha Ti_{1-\alpha})_{1.73}Li_b O_4 \qquad \text{Chemical Formula 2}$$

wherein A is at least one dopant metal selected from Nb, Ta, V, W, Cr, and Mo, α is greater than 0 and less than 1, x is greater than 0 and less than or equal to 0.8, and b is greater than 0 and less than or equal to 0.27; contacting the lithium potassium titanate with an acid solution to obtain an acid-exchanged titanate; contacting the acid-exchanged titanate with an aqueous alkylammonium hydroxide solution to obtain a plurality of nanosheets including a doped titanium oxide represented by Chemical Formula 1 and having a layered crystal structure:

$$(A_\alpha Ti_{1-\alpha})O_{2+\delta} \qquad \text{Chemical Formula 1}$$

wherein δ is greater than 0, A is at least one dopant metal selected from Nb, Ta, V, W, Cr, and Mo, and α is greater than 0 and less than 1; and forming a thin film including a plurality of nanosheets of the doped titanium oxide represented by Chemical Formula 1 to manufacture the electrically conductive thin film.

The lithium potassium titanate may have a longest diameter of greater than or equal to about 10 micrometers.

The lithium potassium titanate may belong to an orthorhombic system and have the space group Cmcm.

The titanium oxide may be represented by the formula $(A_\alpha Ti_{1-\alpha})_{1.73}O_4$, and the content of the content of the dopant metal may be less than about 13 atomic percent, based on a total content of titanium.

The nanosheets may have a longest average length of greater than or equal to about 0.2 micrometers.

The layered crystal structure may belong to an orthorhombic system having the space group Cmcm.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Figure 1:
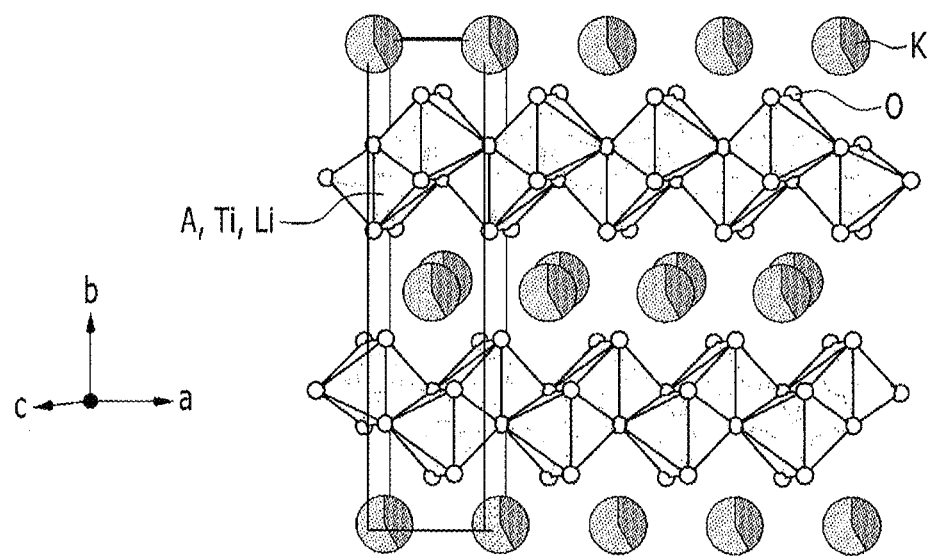
FIG. 1 is a schematic view showing a layered crystal structure of $K_{0.8}[Ti_{1.73}Li_{0.27}]O_4$ (KTLO) doped with a dopant metal A.

Exemplary embodiments will now be described more fully with reference to the accompanying drawings, in which some exemplary embodiments are shown. The exemplary embodiments, may, however, be embodied in many different forms and should not be construed as being limited to the embodiments set forth herein; rather, these exemplary embodiments are provided so that this disclosure will be thorough and complete, and will fully convey the scope of the inventive concepts to those of ordinary skill in the art. Therefore, in some exemplary embodiments, well-known process technologies may not be explained in detail in order to avoid unnecessarily obscuring aspects of exemplary embodiments. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising" will be understood to imply the inclusion of stated elements but not the exclusion of any other elements.

Further, the singular includes the plural unless mentioned otherwise.

In the drawings, the thickness of layers, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

As used herein, the term "doped" means that a dopant element is disposed at an atomic site of atom (e.g. titanium) in a crystal lattice of a base material (a material to be doped) such that the doped base material has substantially the same crystalline structure as the crystalline phase of the base material before the doping. Doping may be confirmed by X-ray diffraction analysis by showing that the doped material does not have a second crystalline phase.

In an embodiment, an electrically conductive thin film includes a plurality of nanosheets including a doped titanium oxide represented by Chemical Formula 1 and having a layered crystal structure:

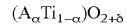

Chemical Formula 1 wherein, in Chemical Formula, δ is greater than 0, A is at least one dopant metal selected from Nb, Ta, V, W, Cr and Mo, and α is greater than 0 and less than 1.

In Chemical Formula 1, δ may be less than about 1, for example, less than about 0.5, or less than or equal to about 0.25. The doped titanium oxide may be a titanium-deficient titanium dioxide. In Chemical Formula 1, α indicates a content of a dopant metal, and may be greater than 0 and less than 1, for example, less than 0.2, less than 0.13, less than or equal to 0.12, less than or equal to 0.11, or less than or equal to 0.1.

In an embodiment, the titanium oxide may be represented by the formula $(A_\alpha Ti_{1-\alpha})_{1.73}O_4$ wherein α and A are the same as defined in Chemical Formula 1. The content of the dopant may be less than about 13 atomic %, for example, less than or equal to about 12 atomic %, less than or equal to about 11 atomic %, or less than or equal to about 10 atomic % based on the content of titanium.

Various efforts have been performed to develop a flexible transparent electrode material having improved electrical conductivity and transparency in the visible light region. In this regard, a metal may have high electron density and high electrical conductivity. However, most metals easily react with oxygen in the air to generate an oxide on the surface, thus the electrical conductivity is remarkably decreased. By using a ceramic material having suitable electrical conductivity in which surface oxidation is decreased, an attempt to decrease the surface contact resistance is made. However, with the currently used electrically conductive ceramic material (e.g., ITO), it is difficult to provide electrical conductivity comparable to a metal and such materials unfavorable flexibility, and a supply of a raw material is unstable. On the other hand, after reporting that a layered material of graphene has conductive characteristics, a monoatomic thin film of a layered structure material having a weak interlayer bonding force has been actively researched. Particularly, much research has been performed to apply graphene as an inherent semi-transparent conductive film material as a substitute for indium tin oxide (ITO), which has unsatisfactory mechanical properties. However, because graphene has a high absorption coefficient (a), it is difficult to provide satisfactory transmittance and to use a thickness of greater than or equal to 4 monoatomic layers. On the other hand, most transition metal dichalcogenides (TMD), which are known to have a layered crystalline structure, may show satisfactory transmittance, but conductivity thereof is around that of a semiconductor and thus it is difficult to apply them as a transparent conductive layer. On the other hand, titanium dioxide has a generally three-dimensional crystal structure such as an anatase crystal structure or a rutile crystal structure, and the titanium dioxide has a wide band-gap of greater than or equal to about 3 eV, and thus has applicability as a transparent material, but has an electrical conductivity as low as in a semiconductor. In addition, titanium oxide having a three-dimensional crystal structure has unfavorable flexibility.

As the doped titanium oxide has a wide bandgap, the excellent transparency is maintained, and the electrical conductivity may be improved compared to a titanium oxide having a three-dimensional crystalline structure such as the anatase or rutile structure. For example, the electrically conductive thin film including the doped titanium oxide nanosheets may have light transmittance of greater than or equal to about 80%, for example, greater than or equal to about 85%, or greater than or equal to about 90%, for light having a wavelength of about 550 nm in a thickness of less than or equal to about 10 nm, and simultaneously, may have significantly improved electrical conductivity (e.g., improved by two times, 10 times, or even 100 times compared to the electrical conductivity of undoped titanium dioxide). For example, the doped titanium oxide may have the significantly improved absorption coefficient and electrical conductivity (or resistivity), which are obtained by computer simulation of the monolayer, compared to the undoped titanium oxide. The product of resistivity ($\rho$) and absorption coefficient ($\alpha$) may be represented by a multiply of a sheet resistance ($R_s$) and transmittance (InT) according to the following relationship, and thus a compound having a smaller $\rho*\alpha$ value or a smaller sheet resistance in a certain transmittance as a material for an electrically conductive thin film is better.

$e^{-\alpha t}=T$(i.e., $\alpha t=-\ln T$)

$R_s=\rho/t$

∴ $\rho*\alpha=R_s*(-\ln T)$

α: absorption coefficient
ρ: resistivity
T: transmittance (at λ=550 nm)
t: thickness
$R_s$: sheet resistance In the computer simulation, the resistivity (ρ) is obtained by calculating the density of states (DOS) and the band structure around the Fermi level from the crystal structure of the corresponding compounds. In addition, the absorption coefficient (α) for a certain wavelength is calculated from the dielectric constant of the compound that is obtained by applying the Drude model and considering electron transition due to inter-band transition. As to simulation methodology for providing the absorption coefficient (α) and the resistivity (ρ), it is possible to further refer to the Vienna Ab-initio Simulation Package (written by Georg Kresse and Jurgen Furthmuller, Institut fur Materialphysik, Universitat Wien, Sensengasse 8, A-1130 Wien, Austria, Aug. 24, 2005, http://cms.mpi.univie.ac.at/VASP or http://www.vasp.at), which is incorporated herein by reference in its entirety. The simulation procedures can be summarized as in Table 1.

TABLE 1

| Calculation step | Simulation level | Calculation/simulation |
|---|---|---|
| Atom electron structure | DFT | Structure optimization<br>Band structure calculation |
| Electrically conductive characteristics | Semi-classical Boltzmann transport (const. τ) | Intra-band transition<br>σ − ($e^2/4\pi^3$) τ ∫ dk v (k) v (k)<br>(−∂f/∂ε) = $ne^2\tau/m_{eff}$ = neμ<br>ρ = 1/σ |
| Dielectric characteristics | DFPT + Drude model | Inter-band transition<br>ε (ω) = $\epsilon_D$ (ω) + $\epsilon_B$ (ω) =<br>$\epsilon_1$ (ω) + i $\epsilon_2$ (ω) |
| Optical characteristics | Ray optics | n (ω) + i k (ω) = ε $(\omega)^{1/2}$<br>Absorption coeff. α = 4πk/λ |
| | Calculate ρα | |

DFT: density-functional theory
DFPT: density-functional perturbation theory
Drude model: free electron model for solid
σ, τ, $m_{eff}$, μ, ρ: electrical conductivity, relaxation time, effective mass, mobility, resistivity
$\omega_p$ ($\omega_p'$): (screened) plasma frequency Hereinbelow, the description of Table 1 is explained in further detail.

In order to calculate a quantum mechanical state of a material, the first-principles calculation (a calculation made from a fundamental equation without using extrinsic parameters) based on the density-functional-theory (DFT) method (a method of solving a quantum mechanical equation by describing the electron distribution using an electron density function instead of a wave function) is performed to calculate the quantum mechanical state of an electron. The VASP (the Vienna Ab initio simulation package code, which is the first principle DFT code) is used to calculate the electron state. A candidate material group including a two-dimensional electron gas (2DEG) layer is selected from the Inorganic Crystal Structure Database (ICSD). The atomic structure information for the candidate material is input and the energy level of the electrons is calculated by simulation, and for such electrons, an energy density function and a state density function on a k-space of the electrons are calculated.

The electron structure calculated through the DFT computer simulation provides an E-k diagram (the band structure) and DOS (Density of States: electron state density, electron state density function per energy unit) information, making it possible to determine whether the given material is a metallic conductive material (DOS($E_F$)>0) or a semiconductor material (DOS($E_F$)=0) depending on the presence of the DOS on the maximum energy level ($E_F$) available to the electrons. In order to predict the conductivity (σ) of a metallically conducting material, its conductive characteristics are estimated by introducing a semi-classical Boltzmann transport model. In this case, relaxation time of electrons (τ: duration during which an electron can move without collision) is assumed to be constant (see Ashcroft and Mermin, Solid State Physics).

Boltzmann-Transport $$\sigma = \left(\frac{e^2}{4\pi^3}\right)\tau \int dk v(k) v(k) \left(-\frac{\partial f}{\partial E}\right)$$

Herein, τ is a relaxation time of an electron, k is a state of the electron in the k-space, v(k) is a speed of the electron in the k state, f is the Fermi-Dirac distribution function, and E is energy. In this case, v(k) may be calculated from the E-k diagram, and σ/τ may be obtained from the above equation.

The mechanism for determining the transmittance absorption of the conductive material may include intra-band absorption due to plasma-like oscillation of free electrons and intra-band absorption due to band-to-band transition of bound electrons. The quantum computational simulation process considering each of the mechanisms may be obtained by the process as set forth in Table 2 entitled "Simulation Table for Optical Properties" (see Ashcroft and Mermin, Solid State Physics).

TABLE 2

| STEP | Category | Calculation | Results | Method (tool) |
|---|---|---|---|---|
| 1 | Optical simulation | Inter-band transition | $\epsilon$ B (w) = $\epsilon$ B1 (w) + i $\epsilon$ B2 (w) | DFT (VASP) |
| 2 | Optical simulation | Plasma frequency Intra-band transition | $\epsilon$ D (w) = $\epsilon$ D1 (w) + i $\epsilon$ D2 (w) | Boltzmann transport DFT (VASP) or Post-processing |
| 3 | Optical simulation | Total dielectric constant Refractive index | | Post-processing |
| 4 | Optical simulation | Reflectance Absorption coefficient | Plasma freq. Reflectance Absorption co. Transmittance | Post-processing |

Herein, B denotes a band and D denotes a Drude model.

In this case, the relationships of the dielectric constant (∈), the refractive index (n), and the absorption coefficient (α) of a solid are shown as follows. For the dielectric constant, both the inter-band transition related portion (∈(Band)) and the intra-band transition related portion (∈(Drude)) should be considered.

$$\varepsilon(\omega) = \varepsilon_{(Drude)} + \varepsilon_{(Band)} = \varepsilon_1(\omega) + i\varepsilon_2(\omega) \quad \text{dielectric function}$$

$$(n + ik)^2 = \varepsilon(\omega) \quad \text{refraction function}$$

$$\alpha(\omega) = 4\pi k / \lambda \quad \text{absorption coefficient}$$

As set forth in the above conductivity calculation, the interband absorption may be calculated through the band structure as calculated in advance while the intra-band absorption by the free electrons is calculated by the simulation as below through the conductivity and optical coefficient calculation based on the Drude modeling (see Jinwoong Kim, Journal of Applied Physics 110, 083501 (2011), which is hereby incorporated by reference in its entirety).

CGS UNIT $\sigma(\omega) = \sigma_0 / [l - i\omega\tau]$ AC conductivity $\sigma_0 = ne^2\tau/m$ DC conductivity $\varepsilon(\omega) = l + i(4\pi/\omega)\sigma(\omega)$ $\omega p^2 \tau = \sigma_0/\varepsilon_0$ (si)

$= 4\pi \sigma_0$ (cgs)

$\varepsilon(\omega) = 1 + i(4\pi/\omega)\sigma_0/[l - i\omega\tau]$ $= l - (4\pi\sigma_0/\omega)/[i + \omega\tau]$ $= l - (4\pi\sigma_0/\omega)(-i + (\omega\tau)2]$ $= l - (\omega_p\tau)2/[l + (\omega\tau)^2] + i(\omega_p\tau)2/[\omega\tau(l + (\omega\tau)^2)]$ $$\epsilon_1 = 1 - \frac{n\omega_p^2\tau^2}{1+\omega^2\tau^2}$$

$$\epsilon_2 = \frac{\omega_p^2\tau^2}{\tau\omega(1+\omega^2\tau^2)}$$

$$n = \frac{1}{\sqrt{2}}\left(\epsilon_1 + (\epsilon_1^2 + \epsilon_2^2)^{1/2}\right)^{1/2}$$

$$k = \frac{1}{\sqrt{2}}\left(-\epsilon_1 + (\epsilon_1^2 + \epsilon_2^2)^{1/2}\right)^{1/2}$$

ω: frequency
$\omega_p$: plasma frequency
k: extinction coefficient

As set forth above, the calculation of the inter-band absorption and the intra-band absorption makes it possible to calculate the dielectric function of the given material, and the optical constants thereof can be simulated therefrom. In the end, the reflectance (R), the absorption coefficient (a), and the transmittance (T) of the given material can be calculated therefrom.

The electrical conductivity (simulation for a monolayer), absorption coefficient (α), conductivity (σ), and sheet resistance ($R_s$) at 90% and 98% transmittance of the doped titanium oxide by the above methods are provided in Table 3.

TABLE 3

| | Composition | $\sigma_{//}$ (S/cm) | $\sigma_{xy}$ (1/cm) | $R_s$ (T = 98%) (Ω/sq) | $R_s$ (T = 90%) (Ω/sq) |
|---|---|---|---|---|---|
| Undoped | $TiO_2$ | 5 | 5357 | 51,124 | 9803 |
| 2.8% doped | $TiO_2$:Nb | 47 | 4599 | 4811 | 923 |
| | $TiO_2$:W | 85 | 4712 | 2733 | 524 |
| | $TiO_2$:V | 10 | 7290 | 37,256 | 7144 |
| | $TiO_2$:Ta | 49 | 4631 | 4651 | 892 |
| 6.25% doped | $TiO_2$:Nb | 181 | 4518 | 1237 | 237 |
| | $TiO_2$:W | 611 | 4868 | 395 | 76 |
| | $TiO_2$:V | 24 | 12146 | 25,564 | 4902 |
| | $TiO_2$:Ta | 199 | 4681 | 1167 | 224 |
| 11.1% doped | $TiO_2$:Nb | 527 | 4841 | 455 | 87 |
| | $TiO_2$:W | 761 | 5116 | 333 | 64 |
| | $TiO_2$:V | 180 | 7139 | 1961 | 376 |
| | $TiO_2$:Ta | 411 | 5525 | 665 | 128 |

As confirmed from the results of Table 3, the doped titanium oxide may have significantly improved electrical conductivity while maintaining the adsorption coefficient similar to that of the undoped material. The oxide included in the electrically conductive thin film according to an embodiment may has a low product (i.e., $R_s$*(−ln T)) found by multiplying the absorption coefficient by the resistivity of less than or equal to about 100, so that it is highly possible to be applied for an electrically conductive thin film.

As the doped titanium oxide has a two-dimensional layered crystalline structure as described in detail below, it may have excellent flexibility when fabricated into nanosheets having a nanometer-order thickness. Nanosheets of the doped titanium oxide may be obtained by exfoliating an oversized monocrystal intermediate material obtained from the flux method, and may have a wide area compared to other nanosheets obtained by the general liquid exfoliation. For example, the nanosheets may have a longest average length of greater than or equal to about 0.2 micrometers (μm), for example, greater than or equal to about 1 μm, greater than or equal to about 2 μm, greater than or equal to 3 μm, greater than or equal to about 4 μm, greater than or equal to about 5 μm, greater than or equal to about 6 μm, greater than or equal to about 7 μm, greater than or equal to about 8 μm, greater than or equal to about 9 μm, or even greater than or equal to about 10 μm. The electrically conductive thin film including nanosheets having a wide area may require a small number of contact points to provide an electrical connection, so the electrical conductivity may be further improved.

In an embodiment, the doped titanium oxide nanosheets having a two-dimensional layered crystal structure may be obtained by providing an intermediate crystalline compound doped with the dopant metal (e.g., potassium lithium titanate doped with a dopant metal, hereinafter referred to as "doped KTLO"); and treating the same with an acid and an alkylammonium salt. Differing from titanium oxide having a three-dimensional bulk crystal structure (e.g., an anatase crystal structure or rutile crystal structure), the doped titanium oxide having a two-dimensional layered crystalline structure may be slid between unit structured layers, and the thin film formed by the obtained nanosheets may have excellent flexibility. Accordingly, the electrically conductive thin film according to an embodiment may be used in a flexible electronic device.

An anatase crystal may belong to a tetragonal system and may have the I41/amd (141) space group, and a rutile crystal may belong to the tetragonal system and may have the P42/mnm (136) space group; on the other hand, the layered crystal structure of the titanium compound represented by Chemical Formula 1 does not belong to these crystalline systems. As a reference, the crystal structure of KTLO, which is an intermediate phase of the titanium compound represented by Chemical Formula 1, may belong to an orthorhombic system and may have the CmCm (63) space group. FIG. 1 is a schematic view showing a layered structure of the intermediate phase KTLO that belongs to an orthorhombic system and has the CmCm (63) space group.

Referring to FIG. 1, the doped intermediate phase KTLO has a layered structure in which a potassium cation is arranged between octahedral layers including $((A_\alpha Ti_{1-a}),Li)O_6$. Titanate and potassium cation are connected by a relatively weak bond, and (as is further described in detail later) the doped titanium oxide nanosheets may be obtained by treating the intermediate phase KTLO with an acid and an alkylammonium salt.

In an embodiment, the electrically conductive thin film may be manufactured according to processes:
obtaining doped titanium dioxide including at least one dopant selected from Nb, Ta, V, W, Cr, and Mo;
mixing the doped titanium dioxide, potassium carbonate, lithium carbonate, and a molybdenum oxide flux in a pre-determined ratio to obtain a lithium potassium titanate (KTLO) represented by Chemical Formula 2 and having a layered crystal structure:

$$K_x(A_\alpha Ti_{1-\alpha})_{1.73}Li_bO_4 \qquad \text{Chemical Formula 2}$$

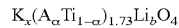

wherein A is at least one dopant metal selected from Nb, Ta, V, W, Cr, and Mo, α is greater than 0 and less than 1, x is greater than 0 and less than or equal to 0.8, and b is greater than 0 and less than or equal to 0.27;
contacting the lithium potassium titanate (KTLO) with an acid solution to obtain acid-exchanged titanate crystal;
contacting, e.g., dipping, the acid-exchanged titanate crystal with an alkylammonium hydroxide aqueous solution to obtain a plurality of nanosheets including doped titanium oxide represented by Chemical Formula 1 and having a layered crystal structure:

$$(A_\alpha Ti_{1-\alpha})O_{2+\delta} \qquad \text{Chemical Formula 1}$$

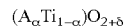

wherein, in the chemical formula, δ is greater than 0, A is at least one dopant metal selected from Nb, Ta, V, W, Cr, and Mo, and α is greater than 0 and less than 1; and
forming a thin film including the plurality of nanosheets.

Figure 2:
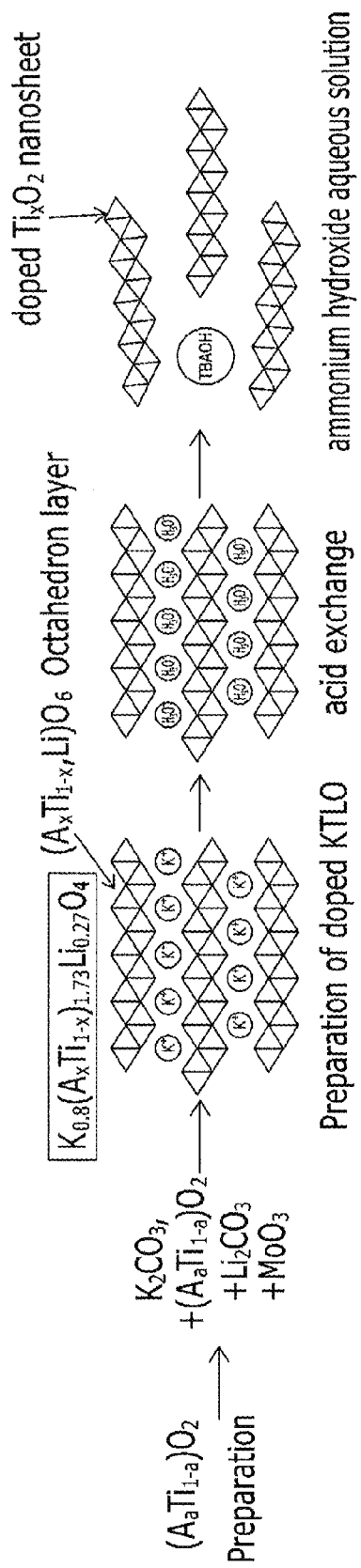
FIG. 2 is a schematic view showing an embodiment of a manufacturing process of a doped titanium oxide nanosheet.

Referring to FIG. 2, the manufacturing method is described in further detail. First, a three-dimensional doped titanium dioxide $(A_\alpha Ti_{1-\alpha})O_2$ (wherein A and α are the same as defined above) is prepared. The three-dimensional doped titanium dioxide may be prepared from a raw material mixture including titanium and a dopant metal using any suitable method, for example, a quartz ampoule method, an arc melting method, a solid-phase reaction method, and the like. Whether a dopant metal is doped or not is confirmed by a lattice constant change and a titanium dioxide monophase formation through X-ray diffraction analysis.

The content of the dopant metal may be, for example, in case of a niobium metal, less than about 20 atomic %, for example, less than about 19 atomic %, less than about 18 atomic %, less than about 17 atomic %, less than about 16 atomic %, less than about 15 atomic %, less than about 14 atomic %, less than about 13 atomic %, less than or equal to about 12 atomic %, less than or equal to about 11 atomic %, or less than or equal to about 10 atomic %, based on the total content of titanium. The content of the dopant metal may be, for example, in case of a niobium metal, greater than or equal to about 0.1 atomic %, for example, greater than or equal to about 0.5 atomic %, greater than or equal to about 1 atomic %, greater than or equal to about 2 atomic %, or greater than or equal to about 3 atomic %, based on the total content of titanium. The content of the dopant metal may be different according to the kind of the dopant metal.

Subsequently, the three-dimensional bulk doped titanium dioxide $(A_\alpha Ti_{1-\alpha})O_2$ is well mixed with a potassium salt, for example, potassium carbonate ($K_2CO_3$), a lithium salt, for example, lithium carbonate ($Li_2CO_3$) and a flux material of a molybdenum oxide (e.g., $MoO_3$) in a desirable mole ratio (e.g., $(A_\alpha Ti_{1-\alpha})O_2:K_2CO_3:Li_2CO_3:MoO_3=1.73:0-1.67:0-0.13:1.27$) to provide a mixture. The amount of a lithium salt and a potassium salt may be adjusted to provide a suitable charge balance depending upon a doping element and a doping amount. The prepared mixture may be heated and melted according to a selected temperature and a time profile, and slowly cooled to provide an A-atom doped lithium potassium titanate (KTLO) having a layered crystal structure represented by Chemical Formula 2:

$$K_{0.8}(A_\alpha Ti_{1-\alpha})_{1.73}Li_bO_4 \qquad \text{Chemical Formula 2}$$

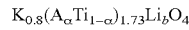

wherein, in the chemical formula, A, x, b, and α are the same as described above.

The doped KTLO may have a layered structure as shown in FIG. 1. The doped KTLO may have a longest diameter of greater than or equal to about 10 μm, for example, greater than or equal to about 100 μm, even greater than or equal to about 1 mm.

The obtained doped lithium potassium titanate (KTLO) crystal is contacted with (e.g., at room temperature) an acid solution (e.g., for a selected time, for example, for greater than or equal to about 10 hours, greater than or equal to 1 day, greater than or equal to 2 days, or the like) to provide an acid-exchanged titanate crystal. Potassium and lithium present in the KTLO layered structure are exchanged by the acid exchange to provide a protonated crystal. As the acid solution, a hydrochloric acid aqueous solution may be used. The concentration of hydrochloric acid aqueous solution may be suitably selected, for example, it may be greater than or equal to about 0.1 mole per cubic decimeter (mol·dm$^{-3}$), for example, greater than or equal to about 0.2 mol·dm$^{-3}$, or greater than or equal to about 0.3 mol·dm$^{-3}$ (e.g., 0.5 mol·dm$^{-3}$), but is not limited thereto.

The obtained acid-exchanged titanate crystal may be collected by a filter and cleaned with pure water and then dried.

When the protonated (i.e., acid changed) titanate crystal is contacted, e.g., dipped, in an ammonium hydroxide aqueous solution (e.g., alkylammonium hydroxide aqueous solution such as a tetrabutylammonium hydroxide solution), the protonated (i.e., acid-exchanged) titanate crystal is exfoliated (delaminated) to provide a plurality of nanosheets including a doped titanium oxide represented by Chemical Formula 1 and having a layered crystal structure:

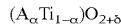
$(A_\alpha Ti_{1-\alpha})O_{2+\delta}$ Chemical Formula 1 wherein, in the chemical formula, δ is greater than 0, A is at least one dopant metal selected from Nb, Ta, V, W, Cr, and Mo, and α is greater than 0 and less than 1.

In non-limiting examples, a small amount of protonated titanate (less than 1 gram, for example, about 0.4 grams) may be exfoliated by reacting with an appropriate amount (e.g., greater than or equal to about 10 cubic centimeters (cm$^3$), greater than or equal to about 50 cm$^3$, or the like) of an alkylammonium hydroxide aqueous solution, e.g., a C1 to C10 alkylammonium hydroxide aqueous solution. The concentration of alkylammonium hydroxide aqueous solution is not particularly limited, but may be appropriately selected considering the amount of exchangeable protons in titanate. For example, the concentration of the hydroxide aqueous solution may range from about 0.0025 to about 0.64 moldm$^{-3}$ (i.e., a mole ratio of about 0.1 to 25 to exchangeable protons in molar titanate), but is not limited thereto.

The titanium oxide in the nanosheets may be represented by $(A_\alpha Ti_{1-\alpha})_{1.73}O_4$, and the content of the dopant metal may be less than about 20 atomic %, less than about 19 atomic %, less than about 18 atomic %, less than about 17 atomic %, less than about 16 atomic %, less than about 15 atomic %, less than about 14 atomic %, less than about 13 atomic %, less than or equal to about 12 atomic %, less than or equal to about 11 atomic %, or less than or equal to about 10 atomic %, based on the total content of titanium.

As KTLO has a large crystal size before the delamination (i.e., exfoliation), the obtained nanosheets may have a larger size than nanosheets generally obtainable from liquid delamination or the like. For example, the nanosheets may have a longest average length of greater than or equal to about 0.2 μm, for example, greater than or equal to about 1 μm, or even greater than or equal to about 10 μm.

The plurality of nanosheets may be contacted to provide an electrical connection and shaped in an electrically conductive thin film. When the prepared nanosheets are physically connected to provide a thin film that is as thin as possible, the obtained film may have further improved transmittance. The obtained film may have coverage of greater than or equal to about 50%. When the thickness is less than or equal to about 20 nm, for example, less than or equal to about 5 nm, the obtained film may have very high transmittance (e.g., greater than or equal to about 80%, or greater than or equal to about 85%). The forming a film using nanosheets may be performed according to any suitable method. For example, the film may be formed according to dip coating, spray coating, spin coating, printing after forming ink or paste, or the like.

In an embodiment, the obtained nanosheets are added into deionized water, and then the dispersion is treated with ultrasonic waves. The ultrasonicated dispersion is added with an organic solvent (e.g., an aromatic hydrocarbon such as xylene and toluene) that is immiscible with water. The obtained mixture is shaken to provide a thin film including nanosheets on an interface between water and the organic solvent. When a wetted and cleaned glass substrate treated with oxygen plasma is lightly dipped in the interface and then slowly taken out, the thin film including the nanosheets is spread on the substrate from the interface. By adjusting the concentration of nanosheets at the interface area of the water/organic solvent and the speed/angle of taking out the substrate, the thickness of the obtained thin film or the like may be controlled.

The electrically conductive thin film may have a high electrical conductivity, high light transmittance, and excellent flexibility, so it may be substituted for an electrode including a transparent conductive oxide such as ITO, ZnO, and the like and a transparent film including Ag nanowire.

Another embodiment provides an electronic device including the electrically conductive thin film. The electrically conductive thin film is the same as described above. The electronic device may be, for example, a flat panel display (e.g., an LCD, LED, or OLED), a touch screen panel, a solar cell, an e-window, a heat mirror, a transparent transistor, or a flexible display, but is not limited thereto.

Figure 17:
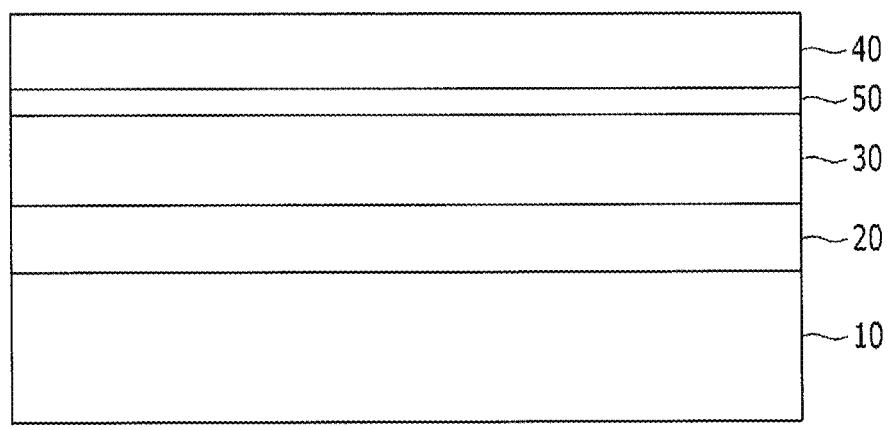
FIG. 17 is a schematic cross-sectional view of an embodiment of an organic light emitting diode device including the electrically conductive thin film.

FIG. 17 is a schematic cross-sectional view of an embodiment of an organic light emitting diode device including the electrically conductive thin film.

An organic light emitting diode device according to an embodiment includes a substrate 10, a lower electrode 20, an upper electrode 40 facing the lower electrode 20, and an emission layer 30 interposed between the lower electrode 20 and the upper electrode 40.

The substrate 10 may include, for example, an inorganic material such as glass or an organic material such as polycarbonate, polymethylmethacrylate, polyethylene terephthalate, polyethylene naphthalate, polyamide, polyethersulfone, or a combination thereof, a silicon wafer, and the like.

One of the lower electrode 20 and the upper electrode 40 is a cathode and the other is an anode. For example, the lower electrode 20 may be an anode and the upper electrode 40 may be a cathode.

At least either one of the lower electrode 20 and the upper electrode 40 is transparent. When the lower electrode 20 is transparent, an organic light emitting diode device may have bottom emission in which light is emitted toward the substrate 10, while when the upper electrode 40 is transparent, the organic light emitting diode device may have top emission in which light is emitted opposite the substrate 10. In addition, when the lower electrode 20 and upper electrode 40 are both transparent, light may be emitted both toward the substrate 10 and opposite the substrate 10.

The transparent electrode is made of the electrically conductive thin film. The electrically conductive thin film is the same as described above. The electrically conductive thin film may have high electron density. The electrically conductive thin film may replace a conventional LiF/Al or MgAg alloy as a single material.

The emission layer 30 may be made of an organic material emitting one light among primary colors such as red, green, blue, and the like, or a mixture of an inorganic material with the organic material, for example, a polyfluorene derivative, a poly(paraphenylene vinylene) derivative, a polyphenylene derivative, a polyfluorene derivative, polyvinylcarbazole, a polythiophene derivative, or a compound prepared by doping these polymer materials with a perylene-based pigment, a coumarin-based pigment, a rothermine-based pigment, rubrene, perylene, 9,10-diphenylanthracene, tetraphenyl butadiene, Nile red, coumarin, quinacridone, and the like. An organic light emitting diode device displays a desirable image by a spatial combination of primary colors emitted by an emission layer therein.

The emission layer 30 may emit white light by combining three primary colors such as red, green, and blue. Specifically, the emission layer 30 may emit white light by combining colors of neighboring sub-pixels or by combining laminated colors in a vertical direction.

An auxiliary layer 50 may be positioned between the emission layer 30 and the upper electrode 40 to improve luminous efficiency. In the drawing, the auxiliary layer 50 is shown only between the emission layer 30 and the upper electrode 40, but is not limited thereto, and may be positioned between and emission layer 30 and the lower electrode 20, or may be positioned between the emission layer 30 and the upper electrode 40, and between the emission layer 30 and the lower electrode 20.

The auxiliary layer 50 may include an electron transport layer (ETL) and a hole transport layer (HTL) for balancing between electrons and holes, an electron injection layer (EIL) and a hole injection layer (HIL) for reinforcing injection of electrons and holes, and the like. It may include one or more layers selected therefrom.

Figure 18:
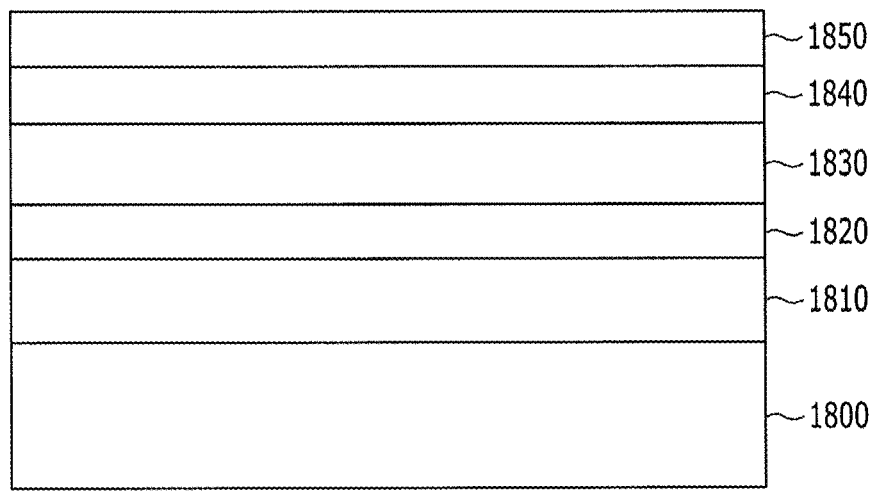
FIG. 18 is a cross-sectional view of an embodiment of a structure of a touch screen panel including an electrically conductive thin film.

In an exemplary embodiment, the electronic device may be a touch screen panel (TSP). The detailed structure of the touch screen panel is well known. The schematic structure of the touch screen panel is shown in FIG. 18. Referring to FIG. 18, the touch screen panel may include a first transparent conductive film 1810, a first transparent adhesive film 1820 (e.g., an optical clear adhesive (OCA) film), a second transparent conductive film 1830, a second transparent adhesive film 1840 and a window 1850 for a display device, on a panel for a display device 1800 (e.g., an LCD panel). The first transparent conductive film and/or the second transparent conductive film may be the electrically conductive thin film.

In addition, an example of applying an electrically conductive thin film according to exemplary embodiments to an organic light emitting diode device or a touch screen panel (e.g., a transparent electrode of TSP) is illustrated, but an electrically conductive thin film according to exemplary embodiments may be used as an electrode for other electronic devices including a transparent electrode without a particular limit. For example, electrically conductive thin films according to exemplary embodiments may be applied as a pixel electrode and/or a common electrode for a liquid crystal display (LCD), an anode and/or a cathode for an organic light emitting diode device, or a display electrode for a plasma display device.

Hereinafter, the embodiments are illustrated in more detail with reference to examples. These examples, however, are not in any sense to be interpreted as limiting the scope of this disclosure.

EXAMPLES

Reference Example 1: Preparation of Niobium (Nb) Doped Titanium Dioxide

Titanium oxide ($TiO_2$) (purity: greater than or equal to 99%, manufacturer: Aldrich) powder and a dopant element of niobium oxide ($Nb_2O_5$) (purity: 99.99%, manufacturer: Aldrich) are mixed in a predetermined mole ratio to provide a mixture having a total sample weight of 5 grams, and then the mixture is heated at 1400° C. under the air to provide a (undoped or Nb-doped) titanium dioxide sintered body having composition.

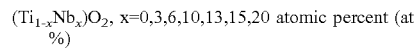

($Ti_{1-x}Nb_x)O_2$, x=0,3,6,10,13,15,20 atomic percent (at %)

Figure 4:
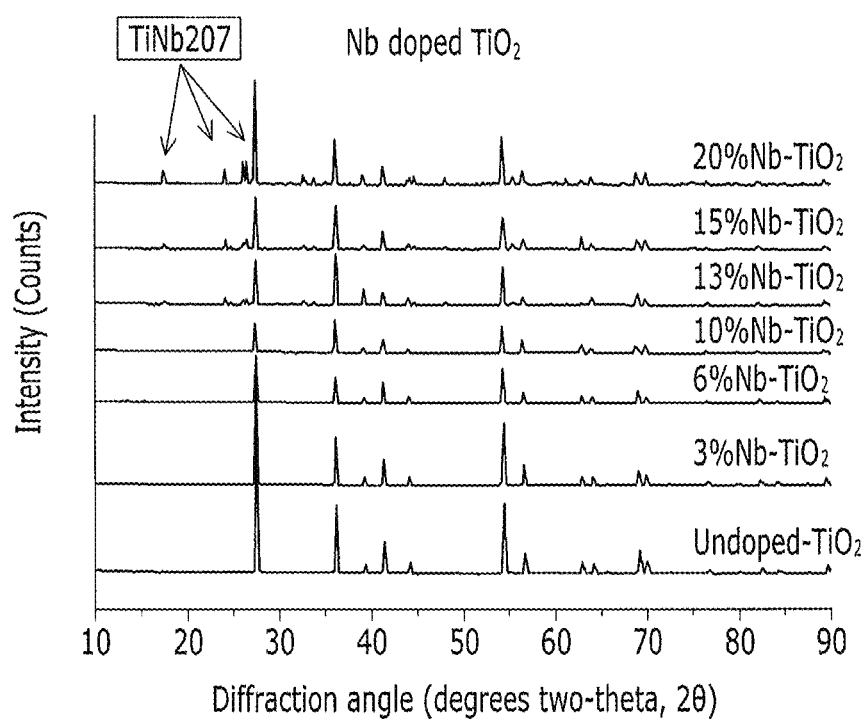
FIG. 4 is a graph of intensity (counts) versus diffraction angle (degrees two-theta, 2θ) which shows the results of X-ray diffraction analysis of an Nb-doped titanium dioxide synthesized in Reference Example 1.
Figure 5:
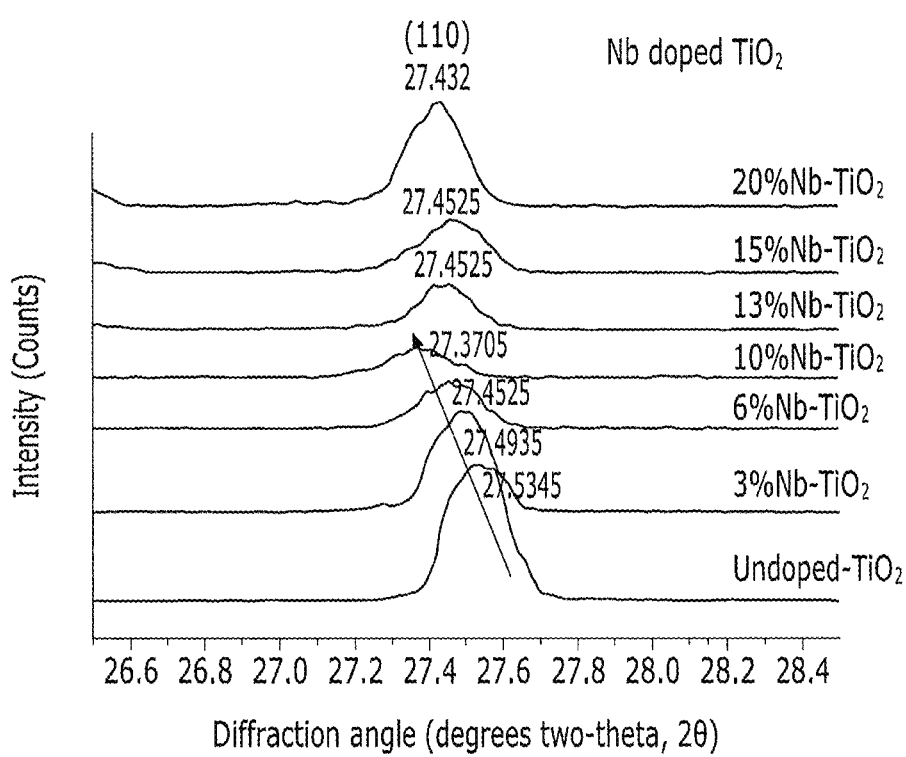
FIG. 5 is a graph of intensity (counts) versus diffraction angle (degrees two-theta, 2θ) which shows the results of X-ray diffraction analysis of the Nb-doped titanium dioxide synthesized in Reference Example 1.

For the obtained sintered bodies, X-ray diffraction analysis is performed, and the results are shown in FIG. 4 and FIG. 5, respectively. From the results shown in FIG. 4 and FIG. 5, it is confirmed that a Nb-doped titanium dioxide is prepared by 10 atomic % from confirming a main phase (110) peak. It is confirmed that the lattice constant is also increased together with increasing the content of the doping metal up to 10 atomic %, which is considered to be because niobium having a larger ion radius ($Nb^{5+}$: 0.780 angstrom) enters into a crystal structure of titanium ($Ti^{4+}$: 0.745 angstrom). When mixing Nb in an amount of greater than or equal to 13 atomic %, $TiNb_2O_7$ is formed in a secondary phase, and it is confirmed that there is no lattice constant increase.

Reference Example 2: Preparation of Tungsten Doped Titanium Dioxide

Titanium oxide ($TiO_2$, purity: greater than or equal to 99%, manufacturer: Aldrich) powder and a dopant element of tungsten oxide ($WO_3$, purity: 99.95%, manufacturer: LTS) are mixed in a predetermined mole ratio to provide a mixture having a total sample weight of 5 grams, and then the mixture is heated at 1100° C. under the air to provide an undoped and W-doped titanium dioxide (composition: ($Ti_{1-x}W_x)O_2$, W=0 and 3 at %) sintered bodies.

Figure 6:
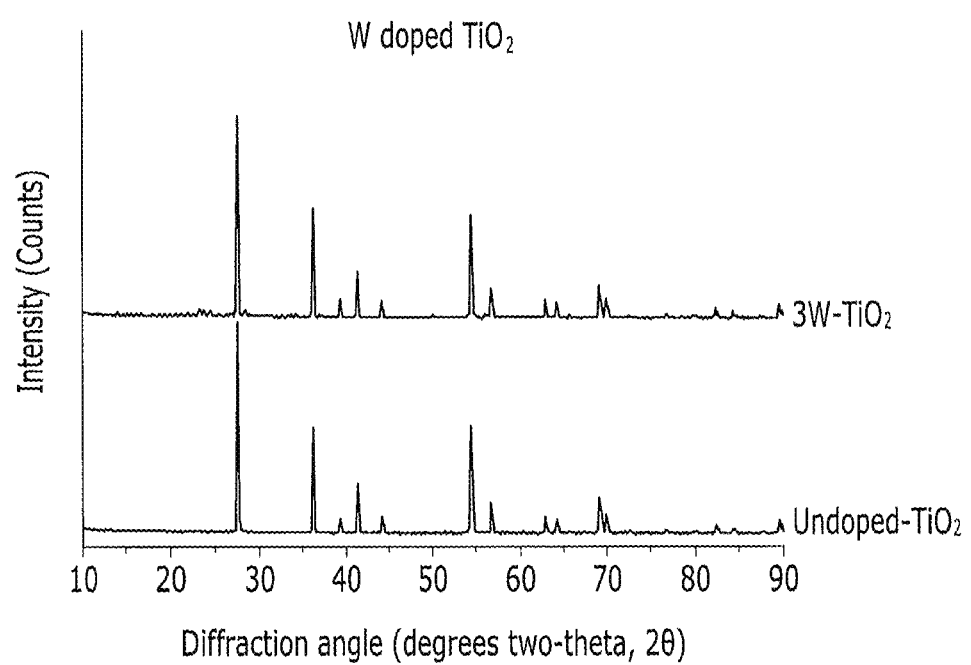
FIG. 6 is a graph of intensity (counts) versus diffraction angle (degrees two-theta, 2θ) which shows the results of X-ray diffraction analysis of a W-doped titanium dioxide synthesized in Reference Example 2.
Figure 7:
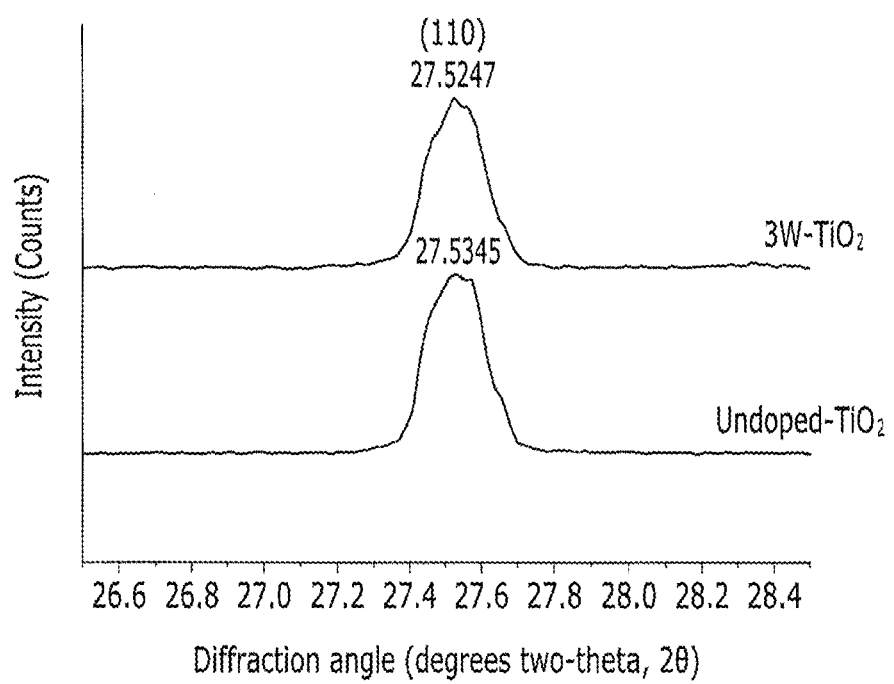
FIG. 7 is a graph of intensity (counts) versus diffraction angle (degrees two-theta, 2θ) which shows the results of X-ray diffraction analysis of the W-doped titanium dioxide synthesized in Reference Example 2.

The obtained sintered bodies undergo X-ray diffraction analysis, and the results are shown in FIG. 6 and FIG. 7, respectively. From the results shown in FIG. 6 and FIG. 7, it is confirmed that W-doped titanium dioxide is prepared in an amount of 3 atomic % by confirming the main phase (110) peak. As tungsten having a similar but slightly smaller ion radius ($W^{6+}$: 0.740 angstrom) enters into a crystal structure of titanium ($Ti^{4+}$: 0.745 angstrom), the lattice constant is not substantially changed.

Example 1

Figure 3:
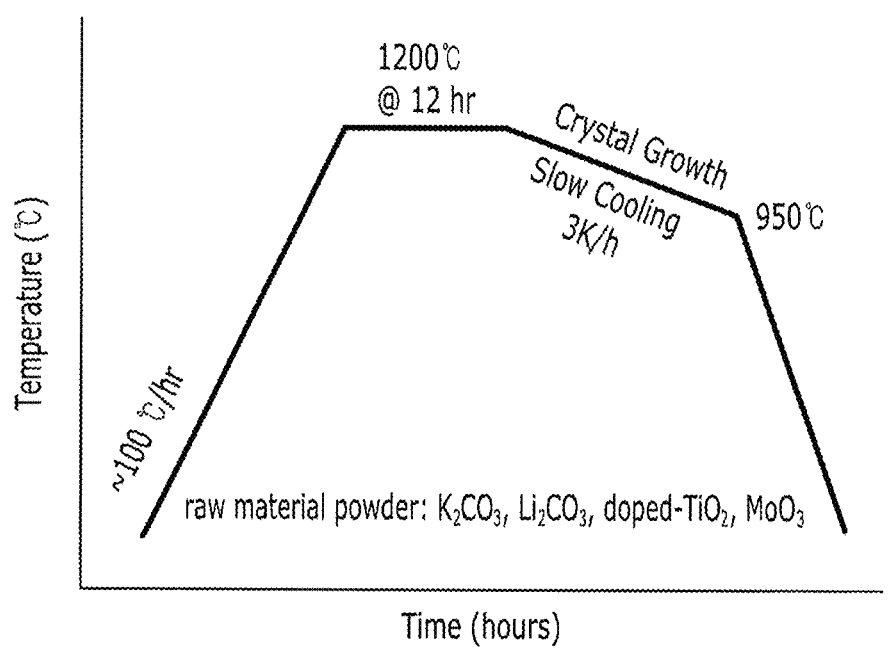
FIG. 3 is a graph of temperature (° C.) versus time (hours) which shows an embodiment of a heat treatment process for synthesizing a KTLO intermediate in the preparation of the doped titanium oxide according to Example 1.

Synthesis (Flux Method) of Niobium Doped KTLO ($K_x(A_\alpha Ti_{1-\alpha})_{1.73}Li_{0.27})O_4$) and Preparation of Niobium Doped Titanium Oxide Nanosheets (1) (3 at %, 6 at %, and 10 at %) niobium doped titanium dioxide prepared from Reference Example 1, potassium carbonate ($K_2CO_3$), lithium carbonate ($Li_2CO_3$), and $MoO_3$ are mixed in a mole ratio of 1.73:1.67:0.13:1.27, and the obtained mixture is input into a Pt crucible and heated under the heating treatment condition shown in FIG. 3 (1200° C., slowly cooling). The prepared sample is cleaned with water to remove $K_2MoO_4$ flux and to provide $K_{0.8}(Nb_xTi_{1-x})_{1.73}Li_{0.27}O_4$ (KTLO) crystal specimens (3Nb-KTLO, 6 Nb-KTLO, 10Nb-KTLO). It is confirmed that the obtained crystal specimens all have a large size of about 1 to about 2 mm.

Each obtained KTLO crystal specimen undergoes X-ray diffraction analysis using an X-ray diffraction analyzer (model name: D8 Advance, manufacturer: Bruker, Germany), and the results are shown in FIG. 8 and FIG. 9.

Figure 8:
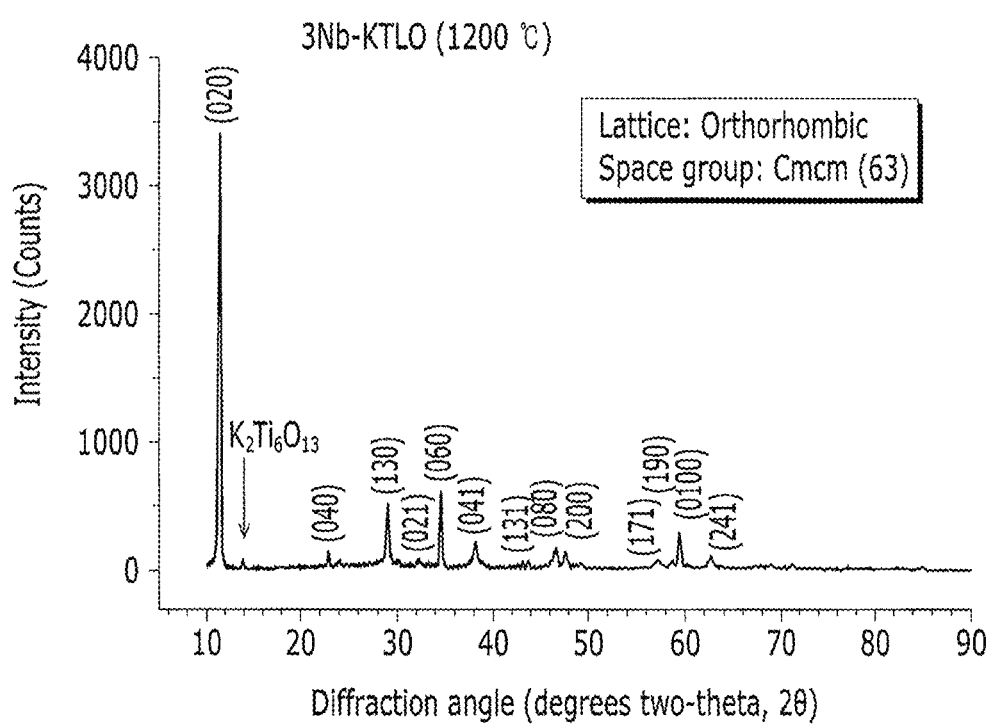
FIG. 8 is a graph of intensity (counts) versus diffraction angle (degrees two-theta, 2θ) which shows the results of X-ray diffraction analysis of a polycrystalline sintered body of 3 at % Nb-doped $K_x(Ti_{1.73}Li_{0.27})O_4$ synthesized in Example 1.
Figure 9:
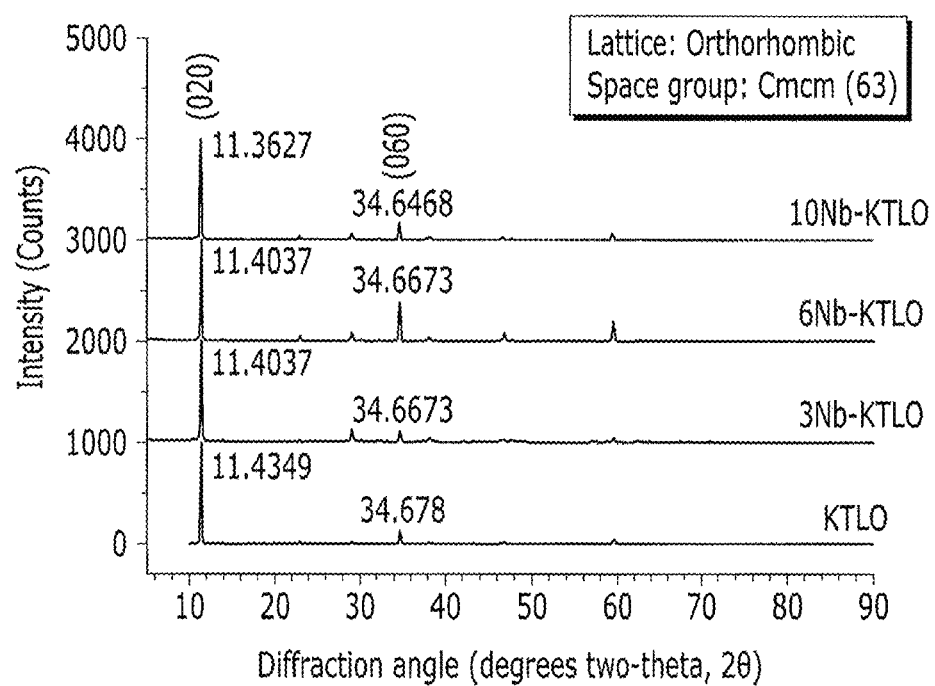
FIG. 9 is a graph of intensity (counts) versus diffraction angle (degrees two-theta, 2θ) which shows the results of X-ray diffraction analysis of undoped KTLO and polycrystalline sintered bodies of 3 at %, 6 at %, and 10 at % Nb-doped $K_x(Ti_{1.73}Li_{0.27})O_4$ synthesized in Example 1.

From the results shown in FIG. 8, it is confirmed that Nb-doped KTLO having an orthorhombic structure without a second phase is prepared. From the results shown in FIG. 9, it is confirmed that Nb-doped KTLO having an orthorhombic structure without a second phase is prepared, the peak position is shifted left according to increasing the doped Nb content, and the b-axis lattice constant is increased.

Figure 10:
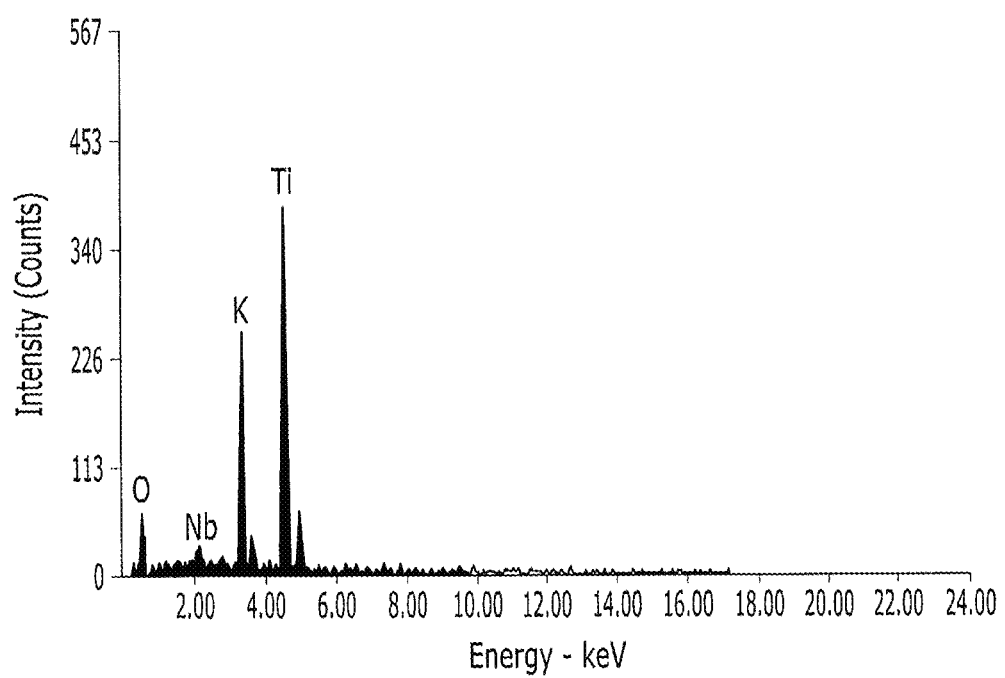
FIGS. 10 to 12 are each a graph of intensity (counts) versus energy (kiloelectron-volts, keV) which show the results of SEM-EDS analysis of polycrystalline sintered bodies of 3 at %, 6 at %, and 10 at % Nb-doped $K_x(Ti_{1.73}Li_{0.27})O_4$ synthesized in Example 1.
Figure 11:
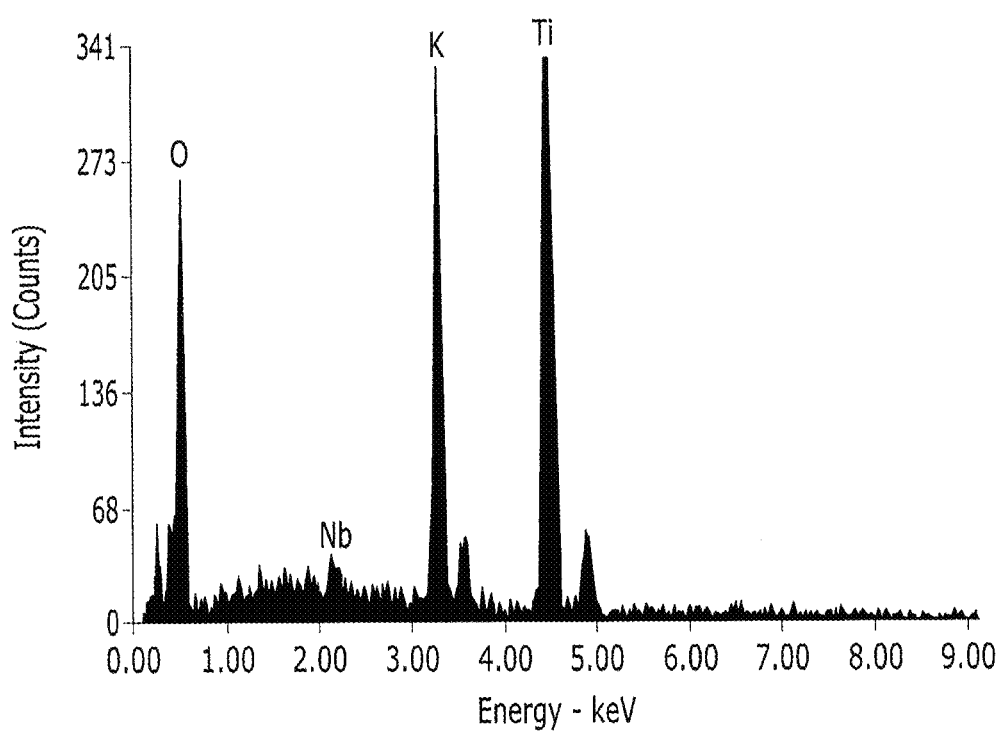
Figure 12:
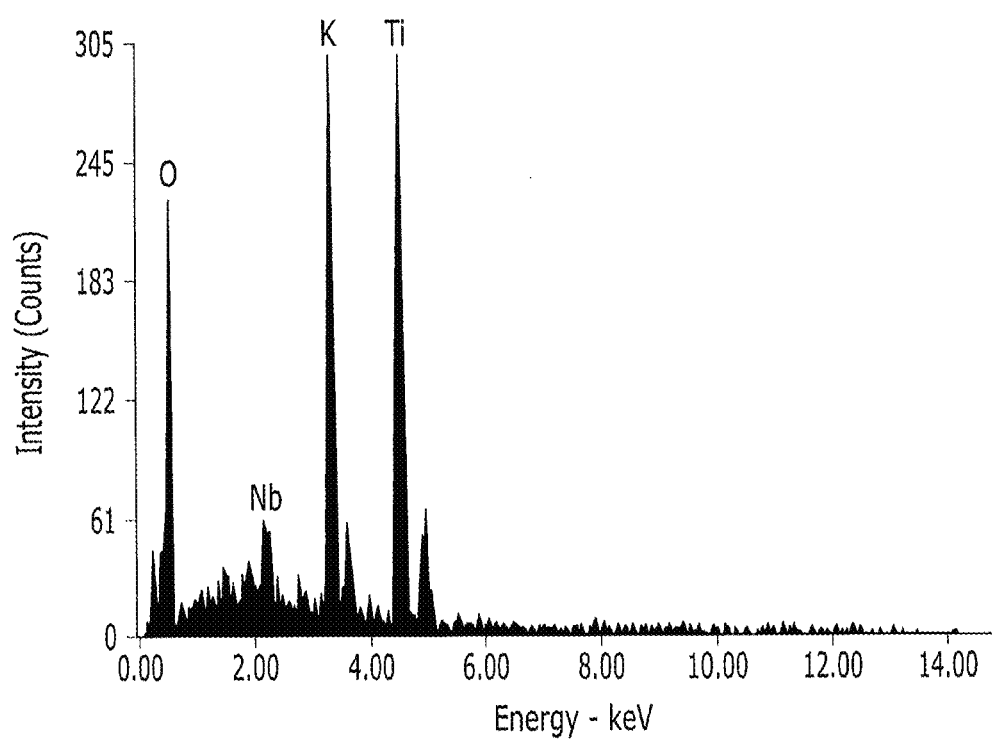

The obtained Nb-doped KTLO crystal specimens undergo SEM-EDS analysis using a scanning electron microscope (model name: Quanta 650 FEG, manufacturer: FEI, USA), and the results are shown in FIG. 10 (3 at % Nb), FIG. 11 (6 at % Nb), and FIG. 12 (10 at % Nb). It is confirmed from EDS analysis that the prepared Nb-doped KTLO crystal specimens show the Nb content increase by increasing the doping amount.

(2) 30 grams of each of the obtained KTLO crystal specimens is added into 0.5 moldm$^{-3}$ of a HCl aqueous solution (2 dm$^3$) and agitated at room temperature for 5 days. After the acid treatment for 5 days, the acid-exchanged titanate crystal is collected by a filter and cleaned with a large amount of water and then dried under the air. 0.4 grams of ion-exchanged titanate is immersed into 100 g of tetrabutylammonium hydroxide aqueous solution (1.2 g TBAOH, mole ratio: TBA+/H+=1) and allowed to stand at room temperature for 14 days to provide nanosheets of Nb-doped titanium oxide. The obtained nanosheets are ground in a mortar and then undergo X-ray diffraction analysis, and the results are shown in FIG. 13.

Figure 13:
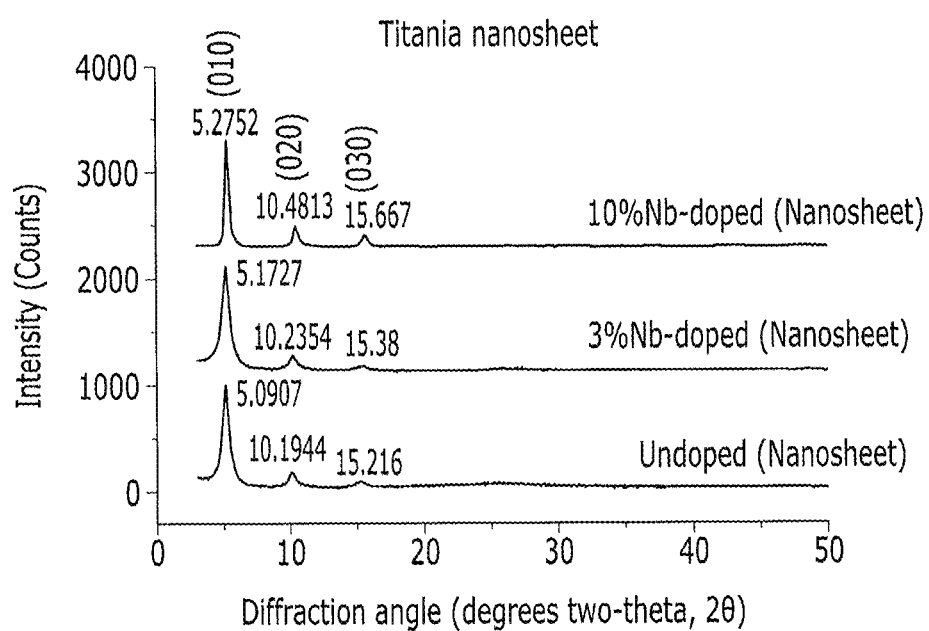
FIG. 13 is a graph of intensity (counts) versus diffraction angle (degrees two-theta, 2θ) which shows the results of X-ray diffraction analysis of a doped titanium oxide nanosheet prepared according to Example 1.

FIG. 13 shows X-ray diffraction analysis results of undoped or Nb-doped titanium oxide nanosheets. On the general X-ray diffraction analysis of nanosheets, only the interplanar spacing information when nanosheets are stacked in a b axis may be obtained. From the results that both undoped and Nb-doped titanium oxide have regular-interval peaks, it is understood that nanosheets are well stacked. In addition, considering that a peak is observed around 5 degrees, it is understood that the interplanar spacing when staked after delaminating into nanosheets is increased, compared to the conventional intermediate phase of KTLO. Comparing the undoped and the Nb-doped titanium oxide, the interplanar spacing is decreased little by little when stacking nanosheets according to an increasing Nb-doping amount. It is considered that the titania nanosheets have a composition of $Ti_{1.73}O_4$.

Figure 14:
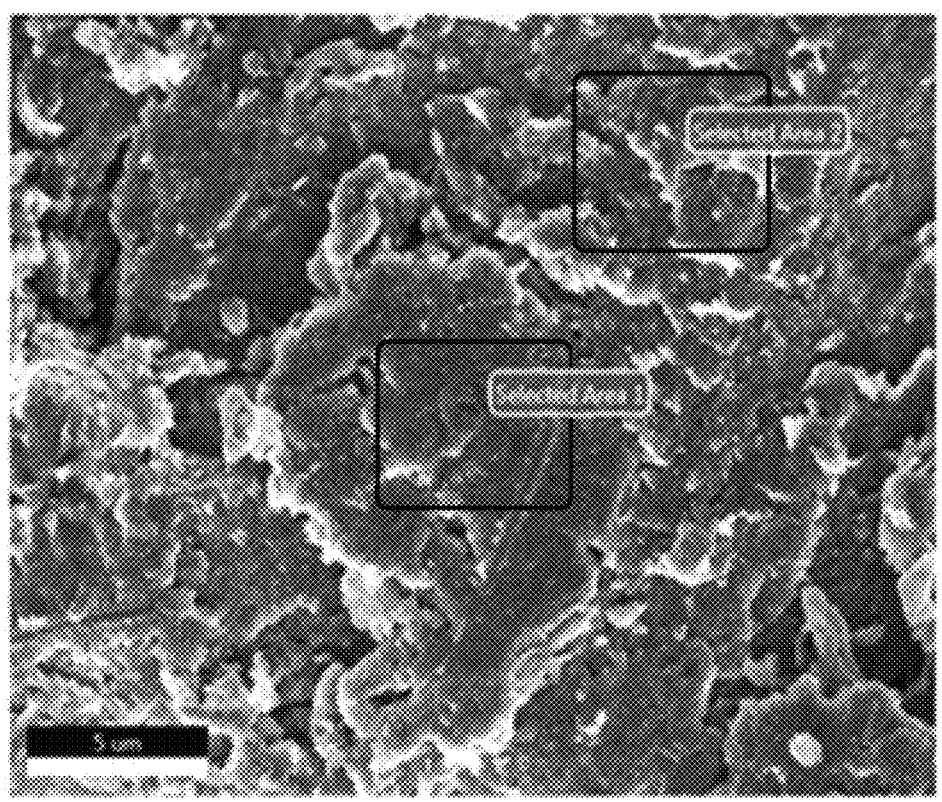
FIG. 14 shows the results of SEM-EDS analysis of an undoped titanium oxide nanosheet prepared according to Example 1.
Figure 15:
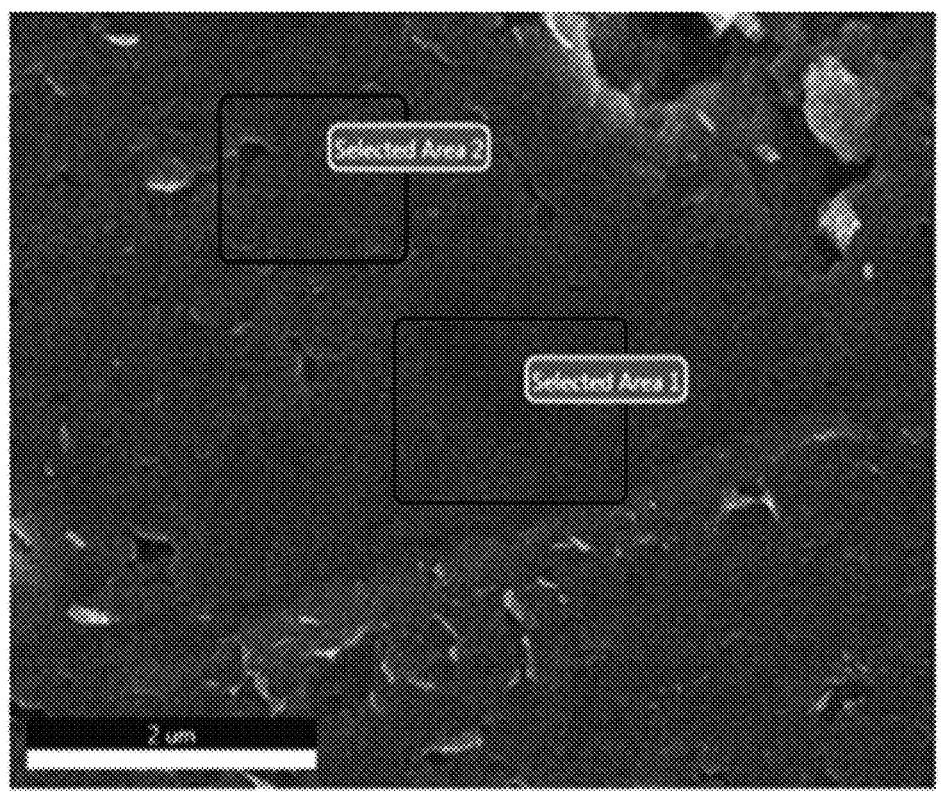
FIG. 15 shows the results of SEM-EDS analysis of a Nb-doped (3 at %) titanium oxide nanosheet prepared according to Example 1.

The undoped nanosheets and the 3% Nb-doped nanosheets are each ground in a mortar, a SEM-EDS analysis is performed using the powder, and the results are shown in FIG. 14 and FIG. 15, respectively, the EDS analysis results for the areas Selected Area 1 and Selected Area 2 in FIG. 14 are provided in Table 4, and the EDS analysis results for the areas Selected Area 1 and Selected Area 2 in FIG. 15 are provided in Table 5. These results confirm that niobium is not detected in the undoped nanosheets. It is confirmed that almost 3 at. % of niobium is included in 3% Nb-doped nanosheets.

TABLE 4

| Selected Area | Element | Weight % | Atomic % | Net Intensity | Error % |
|---|---|---|---|---|---|
| 1 | O | 36.95 | 67.7 | 25.99 | 13.62 |
| 1 | Ti | 63.05 | 36.3 | 30.1 | 8.51 |
| 2 | O | 35.64 | 62.37 | 23.83 | 13.87 |
| 2 | Ti | 64.36 | 37.63 | 29.81 | 8.49 |

TABLE 5

| Selected Area | Element | Weight % | Atomic % | Net Intensity | Error % |
|---|---|---|---|---|---|
| 1 | O | 41.66 | 68.8 | 37.47 | 12.71 |
| 1 | Nb | 3.68 | 1.05 | 4.02 | 33.46 |
| 1 | Ti | 54.66 | 30.15 | 30.45 | 8.65 |
| 2 | C | 26.88 | 43.74 | 53.01 | 8.29 |
| 2 | O | 32.99 | 40.29 | 42.45 | 12.27 |
| 2 | Nb | 2.01 | 0.42 | 3.05 | 39.17 |
| 2 | Ti | 38.11 | 15.55 | 29.11 | 8.78 |

Example 2: Synthesis (Flux Method) of Tungsten Doped KTLO ($K_x(W_{0.3}Ti_{0.7})_{1.73}Li_{0.27}O_4$) and Preparation of Tungsten Doped Titanium Oxide Nanosheets (1) (3 at %) tungsten doped titanium dioxide obtained from Reference Example 2, potassium carbonate ($K_2CO_3$), lithium carbonate ($Li_2CO_3$), and $MoO_3$ are mixed in a mole ratio of 1.73:1.67:0.13:1.27, and the obtained mixture is input into a Pt crucible and heated under the heat treatment condition (1200° C., slowly cooling) shown in FIG. 3. The obtained sample is cleaned with water to remove $K_2MoO_4$ flux and to provide a $K_{0.8}(W_{0.03}Ti_{0.97})_{1.73}Li_{0.27}O_4$ (KTLO) crystal specimen (3W-KTLO). It is confirmed that the obtained crystal specimen has a large size of about 1 to 2 mm.

Figure 16:
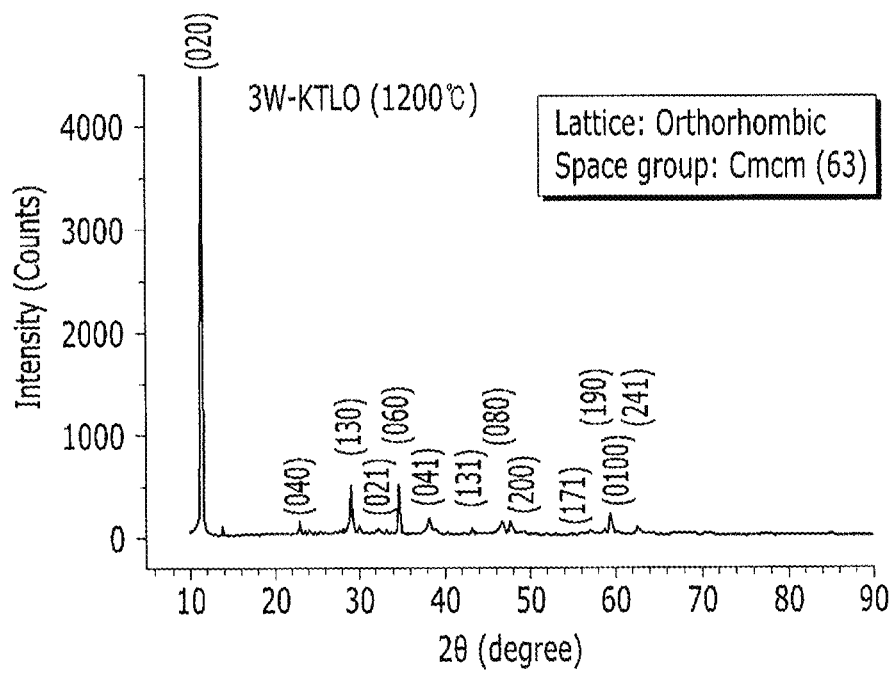
FIG. 16 is a graph of intensity (counts) versus diffraction angle (degrees two-theta, 2θ) which shows the results of X-ray diffraction analysis of an undoped KTLO and polycrystalline sintered body of W-doped $K_x(Ti_{1.73}Li_{0.27})O_4$ synthesized in Example 2.

The obtained tungsten doped KTLO crystal specimen undergoes X-ray diffraction analysis, and the results are shown in FIG. 16.

From the results shown in FIG. 16, it is confirmed that W-doped KTLO having an orthorhombic structure without a second phase is fabricated.

(2) 30 grams of the obtained each KTLO crystal specimen is added into 0.5 moldm$^{-3}$ of a HCl aqueous solution (2 dm$^3$) and agitated at room temperature for 5 days. After the acid treatment for 5 days, the acid-exchanged titanate crystal is collected by a filter and cleaned with a large amount of water and dried under the air. 0.4 grams of the obtained acid-exchanged titanate is immersed in 100 cm$^3$ of tetrabutylammonium hydroxide aqueous solution (concentration: 0.0025 to 0.64 moldm$^{-3}$) and allowed to stand for 5 days to provide nanosheets of W-doped titanium oxide. The obtained nanosheets are ground in a mortar and undergo X-ray diffraction analysis, and the results show that it has an orthorhombic layered crystal structure.

The obtained nanosheets are ground in a mortar and then undergo SEM-EDS analysis, and the results show that tungsten is included in the obtained nanosheets.

Example 3: Preparation of a Thin Film

The niobium doped titanium oxide nanosheets obtained from Example 1 are put into a vial and added with 3 milliliters (mL) of deionized water. 2-3 mL of toluene is added thereto, and the vial is shaken to provide a thin film including nanosheets on the interface between the aqueous layer and the toluene layer. An oxygen plasma treated glass substrate is slightly dipped to the interface and taken up to spread the film including nanosheets of the interface on the glass substrate.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An electrically conductive thin film comprising:
    a plurality of nanosheets comprising a doped titanium oxide represented by Chemical Formula 1 and having a layered crystal structure such that neighboring nanosheets of the plurality of nanosheets can be slid next to each other:

$$(A_\alpha Ti_{1-\alpha})O_{2+\delta} \qquad \text{Chemical Formula 1}$$

wherein, in the Chemical Formula 1, $\delta$ is greater than 0, A is at least one dopant metal selected from Nb, Ta, V, W, Cr, and Mo, and $\alpha$ is greater than 0 and less than 1, and
    wherein the doped titanium oxide represented by Chemical Formula 1 has a different crystal system than an anatase crystal system and a rutile crystal system.

2. The electrically conductive thin film of claim 1, wherein the conductive thin film has light transmittance for light having a wavelength of 550 nanometers of greater than or equal to about 80% at a thickness of less than or equal to 10 nanometers.

3. The electrically conductive thin film of claim 1, wherein the doped titanium oxide is represented by the formula $$(A_\alpha Ti_{1-\alpha})O_{2.31}$$

wherein A is at least one dopant metal selected from Nb, Ta, V, W, Cr, and Mo, and $\alpha$ is greater than 0 and less than 1.

4. The electrically conductive thin film of claim 1, wherein a content of the dopant is less than about 13 atomic percent, based on a total content of titanium.

5. The electrically conductive thin film of claim 1, wherein the plurality of nanosheets have a longest average length of greater than or equal to 0.2 micrometers.

6. The electrically conductive thin film of claim 1, wherein the plurality of nanosheets contact each other to provide an electrical connection.

7. An electronic device comprising the electrically conductive thin film of claim 1.

8. The electronic device of claim 7, wherein the electronic device is a flat panel display, a touch screen panel, a solar cell, an e-window, an electrochromic mirror, a heat mirror, a transparent transistor, or a flexible display.

9. A method of manufacturing an electrically conductive thin film, the method comprising:
    providing a doped titanium dioxide including at least one dopant selected from Nb, Ta, V, W, Cr, and Mo;
    mixing the doped titanium dioxide, potassium carbonate, lithium carbonate, and a molybdenum oxide flux in a selected ratio to obtain a lithium potassium titanate represented by Chemical Formula 2 and having a layered crystal structure:

$$K_x(A_\alpha Ti_{1-\alpha})_{1.73}Li_bO_4 \qquad \text{Chemical Formula 2}$$

wherein A is at least one dopant metal selected from Nb, Ta, V, W, Cr, and Mo, $\alpha$ is greater than 0 and less than 1, x is greater than 0 and less than or equal to 0.8, and b is greater than 0 and less than or equal to 0.27;
    contacting the lithium potassium titanate with an acid solution to obtain an acid-exchanged titanate;
    contacting the acid-exchanged titanate with an aqueous alkylammonium hydroxide solution to obtain a plurality of nanosheets comprising a doped titanium oxide represented by Chemical Formula 1 and having a layered crystal structure such that neighboring nanosheets of the plurality of nanosheets can be slid next to each other:

$$(A_\alpha Ti_{1-\alpha})O_{2+\delta} \qquad \text{Chemical Formula 1}$$

wherein $\delta$ is greater than 0, A is at least one dopant metal selected from Nb, Ta, V, W, Cr, and Mo, and $\alpha$ is greater than 0 and less than 1; and
    forming a thin film including a plurality of nanosheets of the doped titanium oxide represented by Chemical Formula 1 to manufacture the electrically conductive thin film, and
    wherein the doped titanium oxide represented by Chemical Formula 1 has a different crystal system than an anatase crystal system and a rutile crystal system.

10. The method of claim 9, wherein the lithium potassium titanate has a longest diameter of greater than or equal to about 10 μm.

11. The method of claim 9, wherein the titanium oxide is represented by $(A_\alpha Ti_{1-\alpha})_{1.73}O_4$, and a content of the dopant metal is less than about 13 atomic percent, based on a total content of titanium.

12. The method of claim 9, wherein the nanosheets have a longest average length of greater than or equal to about 0.2 micrometer.

13. The method of claim 9, wherein the lithium potassium titanate belongs to an orthorhombic system and has the space group Cmcm.

14. The electrically conductive thin film of claim 1, wherein the doped titanium oxide represented by Chemical Formula 1 is an ion-exchange product of a compound.

* * * * *